US012650461B2

(12) United States Patent
Lee et al.

(10) Patent No.:  US 12,650,461 B2
(45) Date of Patent:      Jun. 9, 2026

(54) USE OF ELECTROMAGNETIC SIGNATURE TO DETERMINE THE TYPE OF INTEGRATED CIRCUIT

(71) Applicant: Ohio State Innovation Foundation, Columbus, OH (US)

(72) Inventors: Robert Lee, Columbus, OH (US); Aditya Nechiyil, Columbus, OH (US); Gregg Chapman, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 197 days.

(21) Appl. No.: 18/566,692

(22) PCT Filed: Apr. 1, 2022

(86) PCT No.: PCT/US2022/023036
§ 371 (c)(1),
(2) Date: Dec. 4, 2023

(87) PCT Pub. No.: WO2022/256076
PCT Pub. Date: Dec. 8, 2022

(65) Prior Publication Data
US 2024/0369618 A1      Nov. 7, 2024

Related U.S. Application Data

(60) Provisional application No. 63/195,820, filed on Jun. 2, 2021.

(51) Int. Cl.
*G01R 31/02*          (2006.01)
*G01R 29/08*          (2006.01)
(Continued)

(52) U.S. Cl.
CPC ..... *G01R 31/2839* (2013.01); *G01R 29/0814* (2013.01); *G01R 31/311* (2013.01)

(58) Field of Classification Search
CPC ............ G01R 31/2839; G01R 31/2844; G01R 31/311; G01R 23/00
See application file for complete search history.

(56) References Cited

U.S. PATENT DOCUMENTS

2004/0100279 A1*   5/2004   Talanov  ............... G01R 31/311
                                                          324/519
2006/0176130 A1*   8/2006   Green  ..................... H01P 1/205
                                                          333/219
(Continued)

FOREIGN PATENT DOCUMENTS

JP          2013072702      *   1/2013

OTHER PUBLICATIONS

International Search Report and Written Opinion, dated Aug. 3, 2022, received in connection with International Patent Application No. PCT/US2022/023036.

*Primary Examiner* — Thang X Le
(74) *Attorney, Agent, or Firm* — Meunier Carlin & Curfman LLC

(57)          ABSTRACT

Systems and methods for detecting anomalous integrated circuits (ICs) are provided. An electrical signature for each of multiple reference ICs are created using a resonator. Each IC may be associated with a different model or manufacturer. Later, when an IC that is suspected of being anomalous is received, its signature is generated and compared with a previously generated signature for an IC of the same make and manufacturer. When the signatures differ by more than a threshold amount, then the IC may be determined to be anomalous. In some embodiments, the generated signatures may be used to train a model that can determine whether an IC is anomalous based on its generated signature or can identify the make and manufacturer of an IC based on its generated signature.

10 Claims, 6 Drawing Sheets

(51) Int. Cl.
  *G01R 31/28*      (2006.01)
  *G01R 31/311*     (2006.01)

(56)          References Cited

U.S. PATENT DOCUMENTS

| | | | |
|---|---|---|---|
| 2015/0219714 A1 | 8/2015 | Hamilton et al. | |
| 2017/0076116 A1 | 3/2017 | Chen et al. | |
| 2019/0227003 A1* | 7/2019 | Ghasr | G07D 7/1205 |
| 2020/0292607 A1* | 9/2020 | Keller, III | G06F 21/73 |
| 2023/0020823 A1* | 1/2023 | Higuchi | H03L 1/028 |

* cited by examiner

100

103

103

405

Receive first and second circuit

410

Generate first signature of first circuit

415

Generate second signature of second circuit

420

Compare first and second signatures

425

Determine that second circuit is anomalous based on comparison

400

Receive plurality of circuits    505

Generate a signature for each circuit    510

Generate model from signatures    515

Receive a first circuit    520

Generate signature for first circuit    525

Determine identifier of first circuit using the model and the generated signature    530

500

USE OF ELECTROMAGNETIC SIGNATURE TO DETERMINE THE TYPE OF INTEGRATED CIRCUIT

CROSS-REFERENCE TO RELATED APPLICATION

This application is a U.S. National Stage application filed under 35 U.S.C. § 371 of PCT/US2022/023036 filed Apr. 1, 2022, which claims the benefit of priority to U.S. Provisional Application No. 63/195,820 filed Jun. 2, 2021, each of which is hereby incorporated herein by reference in their entirety.

STATEMENT OF GOVERNMENT SUPPORT

This invention was made with government support under grant/contract number FA8650-19-1-1741 awarded by the Air Force Research Laboratory. The government has certain rights in the invention.

BACKGROUND

The detection of anomalous integrated circuit (IC) chips is a challenging problem especially if one wants to do the verification without affecting the performance of the chip. As used herein, an IC chip is considered anomalous when it is counterfeit or includes one or more defects or non-standard components.

Currently, the main method used to detect anomalous ICs is a very simplistic approach based on visual inspection. However, anomalies such as defects are difficult to detect visually, and many sophisticated counterfeit ICs are indistinguishable from authentic because visually they look almost exactly the same.

It is with respect to these and other considerations that the various aspects and embodiments of the present disclosure are presented.

SUMMARY

Systems and methods for detecting anomalous integrated circuits (ICs) are provided. An electrical signature for each of multiple reference ICs are created using a resonator. Each IC may be associated with a different model or manufacturer. Later, when an IC that is suspected of being anomalous is received, its signature is generated and compared with a previously generated signature for an IC of the same make and manufacturer. When the signatures differ by more than a threshold amount then the IC may be determined to be anomalous. In some embodiments, the generated signatures may be used to train a model that can determine if an IC is anomalous based on its generated signature or can identify the make and manufacturer of an IC based on its generated signature.

In an implementation, a method comprises: receiving a first integrated circuit and a second integrated circuit by a computing device; generating a first signature of the first integrated circuit using a cavity resonator by the computing device; generating a second signature of the second integrated circuit using the cavity resonator by the computing device; comparing the first signature with the second signature by the computing device; and determining that the second integrated circuit is an anomalous integrated circuit based on the comparison by the computing device.

In an implementation, a method comprises: receiving a plurality of integrated circuits by a computing device, wherein each integrated circuit is associated with an identifier; for each integrated circuit of the plurality of integrated circuits, generating a signature for the integrated circuit by the computing device; generating a model using the signature generated for each integrated circuit by the computing device; receiving a signature for a first integrated circuit not in the plurality of integrated circuits by the computing device; and using the model and the received signature, predicting the identifier associated with the first circuit by the computing device.

In an implementation, a system comprises: a cavity resonator; at least one computing device; and a computer-readable medium storing computer-executable instructions that when executed by the at least one computing device causes the at least one computing device to: generate a first signature of a first integrated circuit using the cavity resonator; generate a second signature of a second integrated circuit using the cavity resonator; compare the first signature with the second signature; and determine that the second integrated circuit is an anomalous integrated circuit based on the comparison.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The accompanying figures, which are incorporated herein and form part of the specification, illustrate systems and methods for identifying anomalous circuits. Together with the description, the figures further serve to explain the principles of the systems and methods for identifying anomalous circuits described herein and thereby enable a person skilled in the pertinent art to make and use the system and method for identifying anomalous circuits.

DETAILED DESCRIPTION

The following description of the disclosure is provided as an enabling teaching of the disclosure in its best, currently known embodiment(s). To this end, those skilled in the relevant art will recognize and appreciate that many changes can be made to the various embodiments of the invention described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Unless defined otherwise, all technical and scientific terms used herein have the same meaning as commonly understood to one of ordinary skill in the art to which this invention belongs. As used in the specification and claims, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein. Publications cited herein are hereby specifically incorporated by reference in their entireties and at least for the material for which they are cited.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Figure 1:
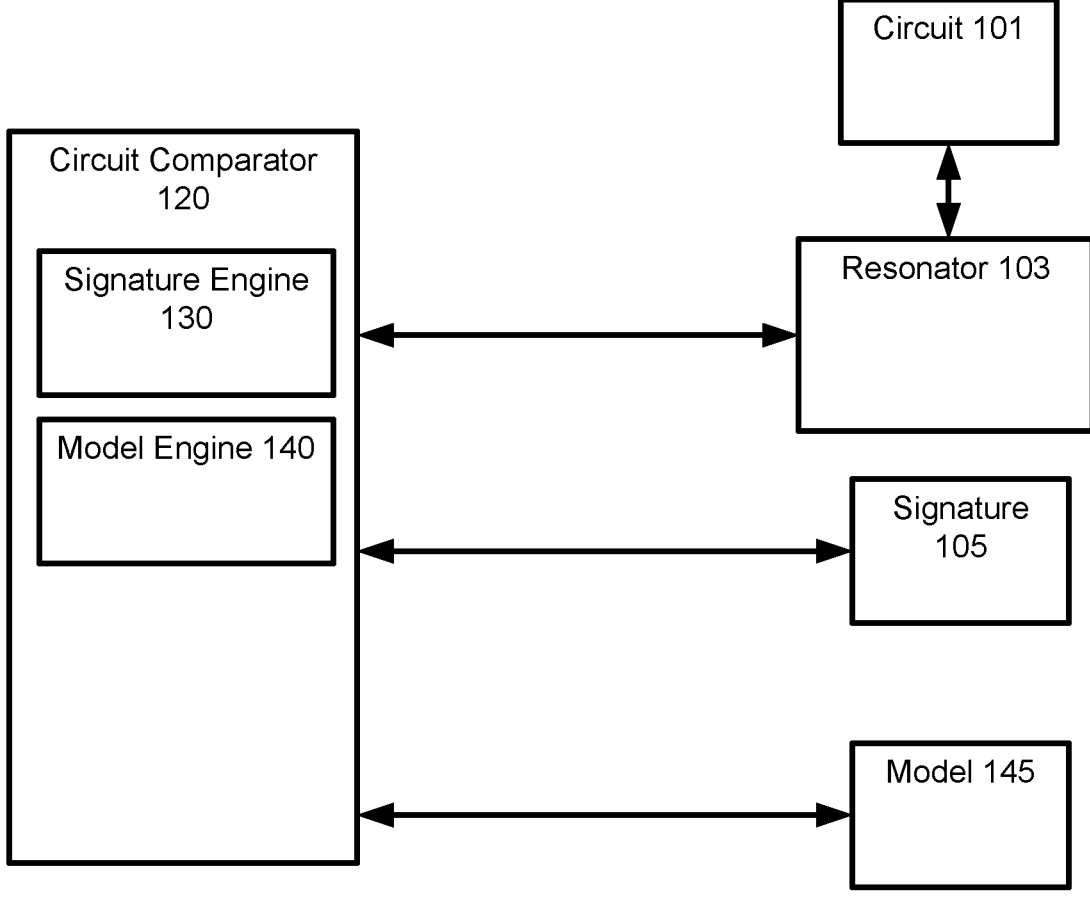
FIG. 1 is an illustration of an environment for identifying anomalous integrated circuits.

FIG. 1 is an illustration of an environment 100 for identifying anomalous integrated circuits (i.e., circuits 101). As used herein, a circuit 101 may be considered anomalous for a variety of reasons including one or more defects, one or more missing or replaced components, and being a counterfeit or including one more counterfeit components. As may be appreciated, anomalous circuits 101 may not work as well or may not be as durable as a corresponding non-anomalous circuit 101. Therefore, the detection of such circuits 101 is desirable.

Each circuit 101 may be associated with a make, model, or type that identifies the circuit 101. Each circuit may further be associated with a year or a version number that can further distinguish the circuit 101 from other circuits.

To facilitate the detection of anomalous circuits 101, the environment 100 may include a circuit comparator 120. The circuit comparator 120 may include one or more components including a signature engine 130 and a model engine 140. More or fewer components may be used. The circuit comparator 120, and each of the components, may be implemented together or separately using one or more general purpose computing devices such as the computing device 600 illustrated with respect to FIG. 6.

In some embodiments, the signature engine 130 may generate a signature 105 for a circuit 101 using a resonator 103. The signature 105 may be an electromagnetic signature that is unique, or mostly unique, to each particular type of circuit 101. The resonator 103 may be a microwave cavity resonator. Other types of resonators may be used.

A microwave cavity resonator 103 is a closed metal box with a hollow chamber inside. The cavity resonator 103 may be substantially rectangular and may be made from a variety of metals such as aluminum. The resonator 103 may be coupled with a sub-miniature version of a probe that is inserted through a hole through the top of resonator 103. The probe may cause electromagnetic waves of various frequencies move through the resonator 103. When the cavity is excited by the electromagnetic waves through the probe, resonant modes are formed corresponding to field variations inside the cavity structure of the resonator 103. The resonant modes formed are either transverse electric (TE) or transverse magnetic (TM) modes and are formed based on the orientation of the electric or magnetic field vectors corresponding to the direction of propagation of the electromagnetic waves in the resonator 103. At these resonant frequency values, the moving electromagnetic waves form standing waves resulting in a high return loss.

Figure 2:
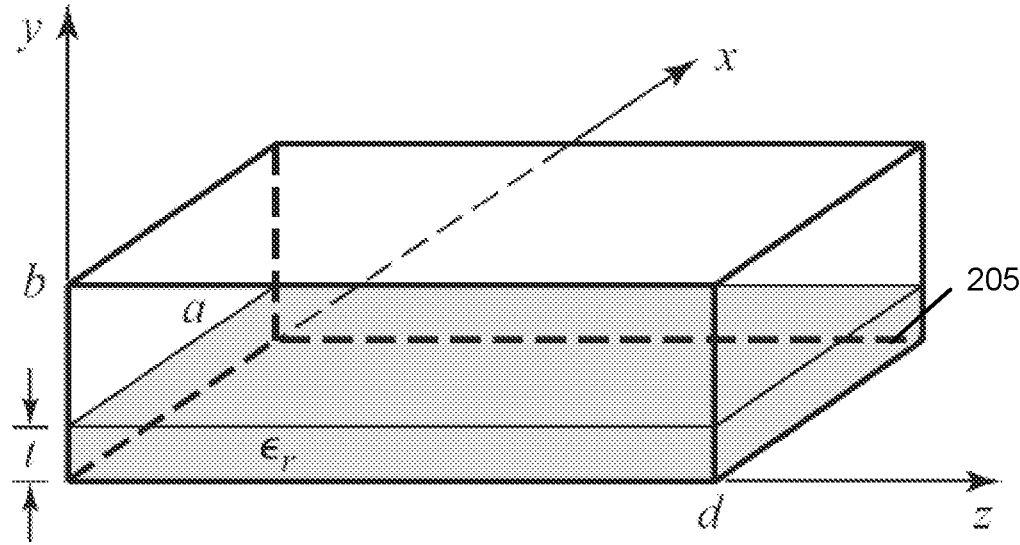
FIG. 2 is an illustration of an example resonator showing material perturbation.

FIG. 2 is an illustration of an example resonator 103. The location of the resonant frequencies formed in the resonant modes can be calculated using the geometry of the rectangular cavity of the resonator 103 under the assumption that the cavity is empty and lossless. The reference letters a, b, and d in FIG. 2 corresponds to the dimensions of the cavity of the resonator 103. The resonate frequencies $f_{mnl}$ can be calculated using the following equation 1 where m, n, p represents the resonant modes and c is the speed of light in vacuum.

$$f_{mnl} = \frac{c}{2\pi} \sqrt{\left(\frac{m\pi}{a}\right)^2 + \left(\frac{n\pi}{b}\right)^2 + \left(\frac{p\pi}{d}\right)^2} \qquad (1)$$

When an object is placed in the resonator 103 (such as a circuit 101), it shifts the resonant frequency value based on the dielectric properties and shape of the inserted object. This shift in frequency can be approximated using the perturbational method which assumes that the actual fields of a cavity with a small shape or material perturbation are not greatly different from those of the unperturbed cavity. To demonstrate the effects of material and shape perturbations, two examples are shown in FIG. 2 and FIG. 3.

Referring to FIG. 2 is an example of material perturbation. In the example shown a thin dielectric slab 205 is inserted into the bottom of the cavity of the resonator 103. The fractional change in the dominant resonant frequency can then be derived as seen in equation 2 where $\epsilon_r$ is the relative permittivity:

$$\frac{\omega - \omega_0}{\omega_0} = \frac{-(\epsilon_r - 1)t}{2b} \qquad (2)$$

Figure 3:
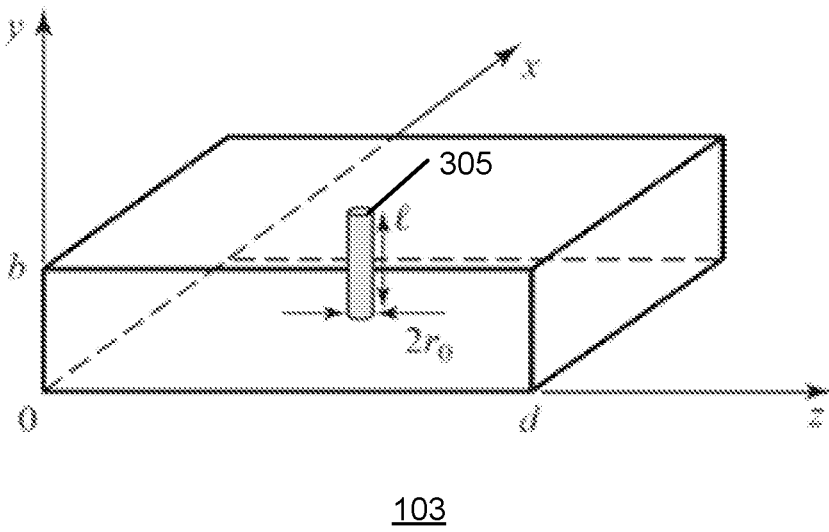
FIG. 3 is an illustration of an example resonator showing shape perturbation.

Referring to FIG. 3, an example of shape perturbation is described. In the example shown, a thin screw 305 with radius r and height 1 is inserted into the cavity of the resonator 103. The fractional change in the dominant resonant frequency can be derived as seen in the equation 3:

$$\frac{\omega - \omega_0}{\omega_0} = \frac{-2l\pi r_0^2}{abd} \qquad (3)$$

The return loss is the ratio of the incident power to that of the reflected power and is expressed as a ratio in decibels (dB). At the resonant frequency, the amount of reflected waves is minimized, causing the return loss to be a large positive value. This value can also be viewed as the input impedance of the cavity resonator 103. Typically, the input impedance at resonance is real and can be viewed as purely resistive. The precise value of the return loss at each resonant frequency value depends on several factors such as the matching of the cavity with that of the characteristic impedance of the attached input cable, the resistivity of the cavity walls, the dielectric properties of the cavity or any object inside, etc. The return loss may be calculated using the following equation 4 where $P_i$ is the incident power and $P_r$ is the reflected power.

$$\text{Return Loss (dB)} = 10 \cdot \log_{10}\frac{P_i}{P_r} \tag{4}$$

As demonstrated with the perturbation equations above, the resonant frequencies of the cavity resonator 103 shifts based on the shape and material properties of any object inserted inside it. If the shift in the resonant frequency and return loss values were captured at multiple modes, those values can be used to create a unique signature 105 that could be used to uniquely identify an object such as circuit 101. Furthermore, if the shift in resonant frequencies of the object were to be collected for the same object at various orientations inside the cavity, those values could be further used as additional data to uniquely identify each object.

Accordingly, the signature engine 130 may create a signature for a circuit 101 by placing the circuit 101 in the resonator 103 at a variety of predetermined positions. At each position, the signature engine 130 may measure the resonant frequency values and return loss values for a variety of modes. The measured resonant frequency values and return loss values for the modes at each predetermined position may be used by the signature engine 130 as the signature 105 for the circuit 101.

In some embodiments, the cavity resonator 103 may have dimensions of approximately 14.2 cm×5.03 cm×7.57 cm, and an inner cavity with dimensions of approximately 11.19 cm×2.79 cm×5.58 cm. Based on the dimensions of the inner cavity and calculating the resonant frequencies for the first four transverse electric (TE) modes, the cavity resonator would theoretically consist of a fundamental frequency, TE101 mode at 3.00 GHZ, TE102 mode at 3.79 GHz, TE103 mode at 4.83 GHZ, and TE104 mode at 5.99 GHz.

When the signature engine 130 generates signatures 105 for circuits 101 of the same type (e.g., the same model and manufacturer) using the resonator 103 as described above, the signatures 105 should be approximately the same. Thus, when a first circuit 101 of the same type and a second circuit 101 of the same type have different signatures, it may indicate that one of the circuits 101 is an anomalous circuit 101. For example, one of the circuits 101 may be counterfeit or defective which is causing the differences between the signatures 105.

In some embodiments, in order to use signatures 105 to identify anomalous circuits 101, the signature engine 130 may generate a plurality of signatures 101 for a variety of different circuits 101. The circuits 101 may include circuits 101 of a variety of different makes, models, and manufacturers. These signatures 105 may be stored by the signature engine 130.

Later, a user may desire to determine whether a particular circuit 101 is an anomalous circuit 101. The user may insert the circuit 101 into the resonator 103 and the signature engine 130 may determine the signature 105 of the circuit 101. When the generated signature 105 does not match a stored signature 105 of the same make, model, or type of circuit 101, then the signature engine 130 may determine that the circuit 101 is anomalous.

In some embodiments, the signature engine 130 may determine whether two signatures match by subtracting them from each other and taking the absolute value. The greater the difference between two signatures 105, the less likely that the signatures 105 are matches. In some embodiments, when the difference between the signatures 105 is less than a threshold, then the signatures 105 are considered to match. Otherwise, they are not considered to match 105. The threshold may be set by a user or an administrator.

In some embodiments, rather than compare signatures 105 directly, the model engine 140 may generate a model 145 that can be used to determine whether a first circuit 101 and a second circuit 101 are the same type of circuit 101, or whether one of the circuits 101 is an anomalous circuit 101. The model 145 may take as an input a signature 105 generated for the first circuit 101 and a signature 105 generated for the second circuit 101, and may output a probability or confidence that the circuits 101 are the same types of circuit or that one of the circuits 101 is an anomalous circuit. In some embodiments, the model 145 may be a support vector machine classifier. However, other types of models 145 may be used such as a random forest classifier, a k-nearest neighbor classifier, or a binary classifier. Other types of models may be supported.

In some embodiments, the model engine 140 may train the model 145 by generating training data. The model engine 140 may first generate the training data by gathering, for each type of circuit 101, a circuit 101 known to be correct or non-anomalous and a circuit 101 known to be anomalous. For each type of circuit 101, the model engine 140 may use the resonator 103 to generate signatures 105 for the non-anomalous circuit 101 and the anomalous circuit 101. For each type of circuit 101, differences between the signatures 105 of the non-anomalous circuits 101 are labeled as non-anomalous and differences between the signatures of the anomalous and non-anomalous circuits are labeled as anomalous. The model engine 140 may then use the labeled differences to train the model 145.

In some embodiments, rather than train a model 145 to determine whether two circuits 101 are the same or whether one is anomalous, the model engine 140 may train a model 145 to identify the type or make of a circuit 101 based on its generated signature 105. To generate such a model 145, the model engine 140 may generate signatures 105 for each of a plurality of different circuits 101 types using the resonator 103 as described above. Each circuit 101 may be known to be non-anomalous. Each generated signature 105 may be labeled with an identifier that uniquely identifies the type or model of circuit 101 that it was generated from. The model engine 140 may then train the model 145 using the labeled signatures.

Later, when a user desires to learn whether a particular circuit 101 is anomalous, the user may use the resonator 103 to generate a signature 105 for the circuit 101. The model engine 140 may then use the model 145 and the generated signature 105 to predict the type or model of the circuit 101 along with a confidence score associated with the prediction. When the predicted type and the known type of the circuit 101 match, and the prediction is associated with a high confidence, then the user may determine that the circuit 101 may not be anomalous. Otherwise, the user may determine that the circuit 101 may be anomalous.

In some embodiments, the model engine 130 may generate a plurality of signatures 105 for a plurality of circuits 101. The model engine 130 may then use clustering techniques to generate clusters based on the generated signatures 105. Later, circuits 101 whose signatures 105 are associated with or near one of the generated cluster may be determined to be non-anomalous, while circuits 101 whose signatures 105 are not associated with any cluster may be determined to be anomalous.

Figure 4:
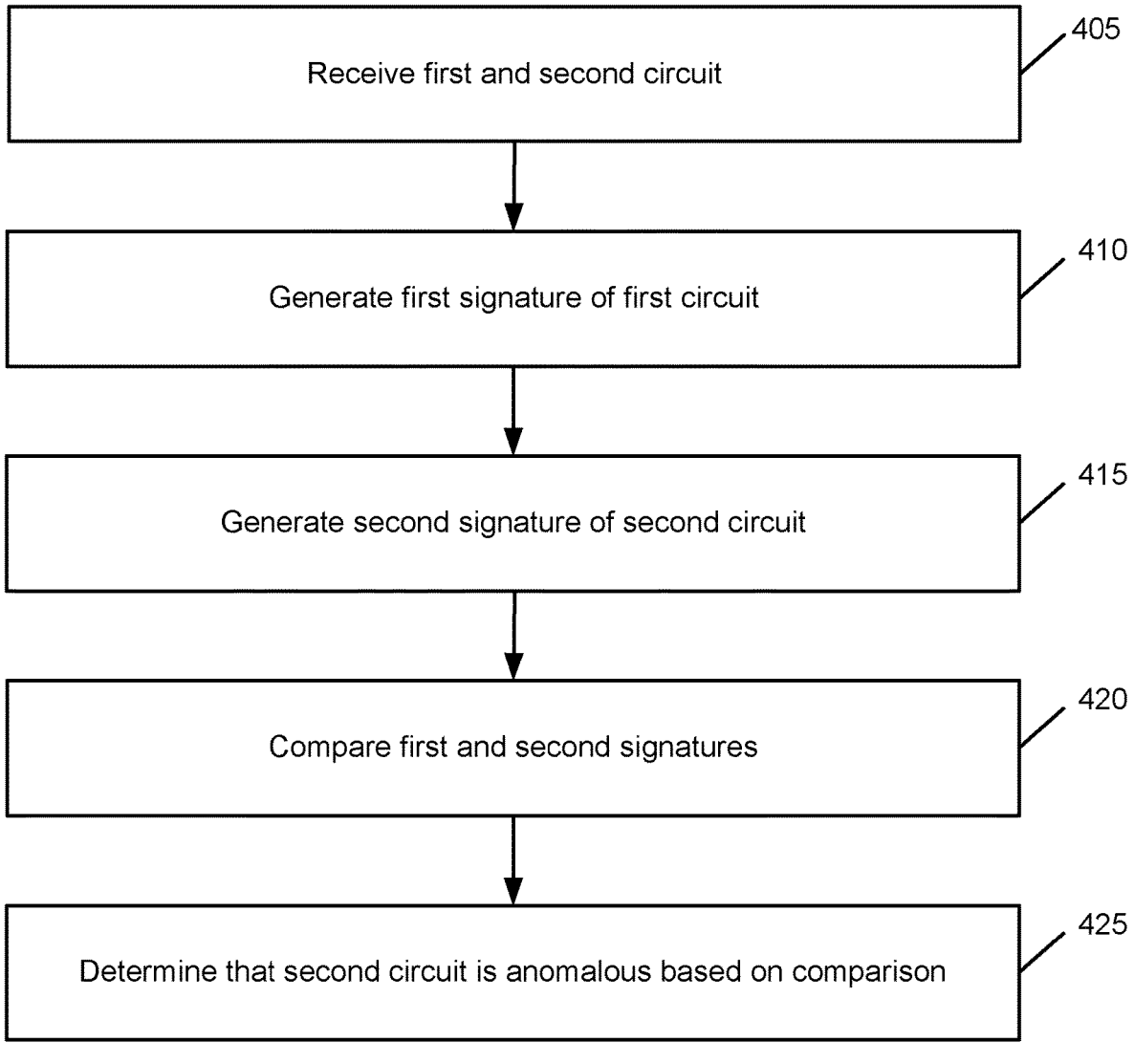
FIG. 4 is an illustration of an example method for determining whether a circuit is anomalous.

FIG. 4 is an illustration of an example method 400 for determining whether a circuit 101 is anomalous. The method 400 may be implemented by the circuit comparator 120.

At 405, a first circuit and a second circuit are received. The first circuit 101 and the second circuit 101 may be integrated circuits and may be received by the circuit comparator 120 from a user. The user may desire to determine whether the first circuit 101 and the second circuit 101 are the same type (e.g., the same make, model, or manufacturer), or whether the second circuit 101 is anomalous (e.g., a counterfeit version of the first circuit 101, or a version of the first circuit 101 that has errors or has been modified in some way). The first circuit 101 and the second circuit 101 may appear to be the same type of circuit based on a visual inspection.

At 410, a first signature is generated of the first circuit. The first signature may be generated by the signature engine 130. In some embodiments, the signature 105 may be generated by placing the first circuit inside of a cavity resonator 103 and providing radio waves through the resonator 103. The resonate frequencies and return losses of the radio waves are measured in the resonator 103 for each of a plurality of different positions of the circuit 101 in the resonator. These resonate frequencies and return losses measured for each position are used by the signature engine 130 to generate the signature 105 for the first circuit 101.

At 415, a second signature is generated of the second circuit. The second signature 105 may be generated by the signature engine 130 for the first circuit 101 using the resonator 103 similarly as described for the first circuit 101.

At 420, the first and the second signatures are compared. The first signature 105 and the second signature 105 may be compared by the signature engine 130. In some embodiments, the signature engine 130 may compare the first signature 105 with the second signature 105 by subtracting the first signature 105 from the second signature 105 and taking the absolute value of the difference. Other methods for comparing values may be used.

At 425, that the second circuit is anomalous is determined based on the comparison. That the second circuit 101 is anomalous may be determined by the circuit comparator 120. In some embodiments, the circuit comparator 120 may determine that the second circuit 101 is anomalous when the difference is more than a threshold value.

Figure 5:
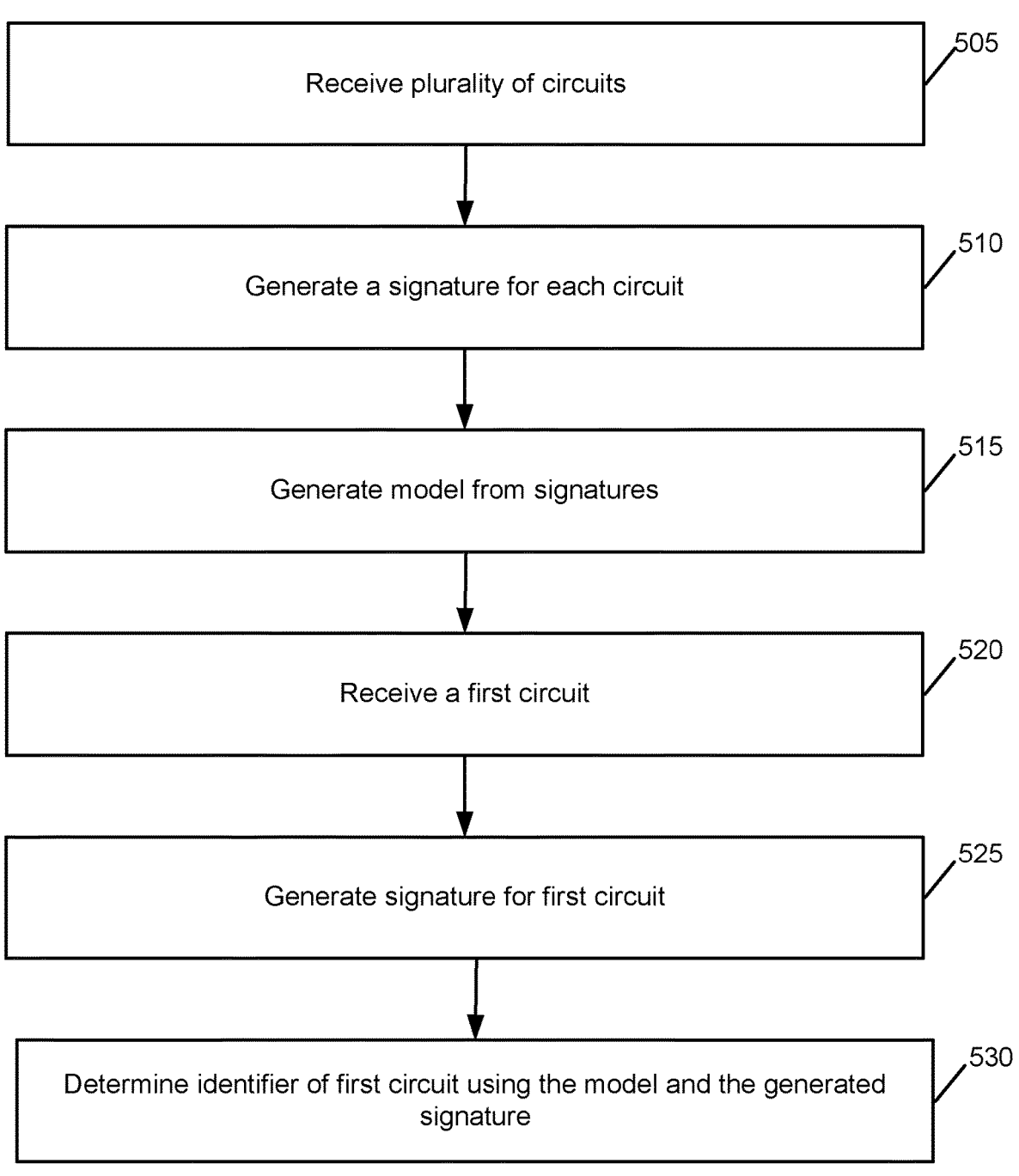
FIG. 5 is an illustration of an example method for determining an identifier of a circuit using a model.

FIG. 5 is an illustration of an example method 500 for determining an identifier of a circuit using a model. The method 500 may be implemented by the circuit comparator 120.

At 510, a signature is generated for each circuit of a plurality of circuits. The signature 105 may be generated for each circuit of a plurality of circuits 101 by the signature engine 130 using the resonator 103. Each circuit 101 of the plural of circuits 101 may be associated with an identifier that uniquely identifies information about the circuit 101 such as type, model, or manufacturer. The circuits 101 of the plurality of circuits 101 may be different circuits 101 and may each be associated with a different identifier. Depending on the embodiment, some or all of the circuits 101 may be known to be authentic or non-anomalous.

At 515, a model is generated from the signatures. The model 145 may be generated by the model engine 140. Each generated signature 105 may be labeled using the identifier of the associated circuit 101 and may be used to train the model 145. The model 145 may be a variety of artificial intelligence model including a random forest classifier, a k-nearest neighbor classifier, or a support vector machine. Other types of models 145 may be used.

At 520, a first circuit is received. The first circuit 101 may be received by the circuit comparator 120 from a user. The first circuit 101 may be of a same type as a circuit 101 that was used to make the model 145. The user may desire to learn whether the first circuit 101 is anomalous. For example, the user may have purchased the first circuit 101 for a project and may desire to learn whether the first circuit 101 is counterfeit before incorporating it into a project.

At 525, a signature is generated for the first circuit. The signature 105 of the first circuit 101 may be generated by the signature engine 130 using the resonator 103 as described above.

At 530, an identifier is determined for the first circuit using the model and the generated signature. The identifier may be determined by the model engine 140 using the model 145 and the signature 105. The identifier may be a prediction of the identifier associated with the first circuit 101. The user may use the identifier to determine the predicted type or model of the circuits 101. When the predicted type or model matches the type of model that the user thought was associated with the first circuit 101, then the user may determine that the first circuit 101 is authentic or non-anomalous. In some embodiments, the model 145 may output a confidence value that the predicted identifier is correct. When the confidence is low, the user may determine that the first circuit 101 is possibly damaged or associated with a defect.

Figure 6:
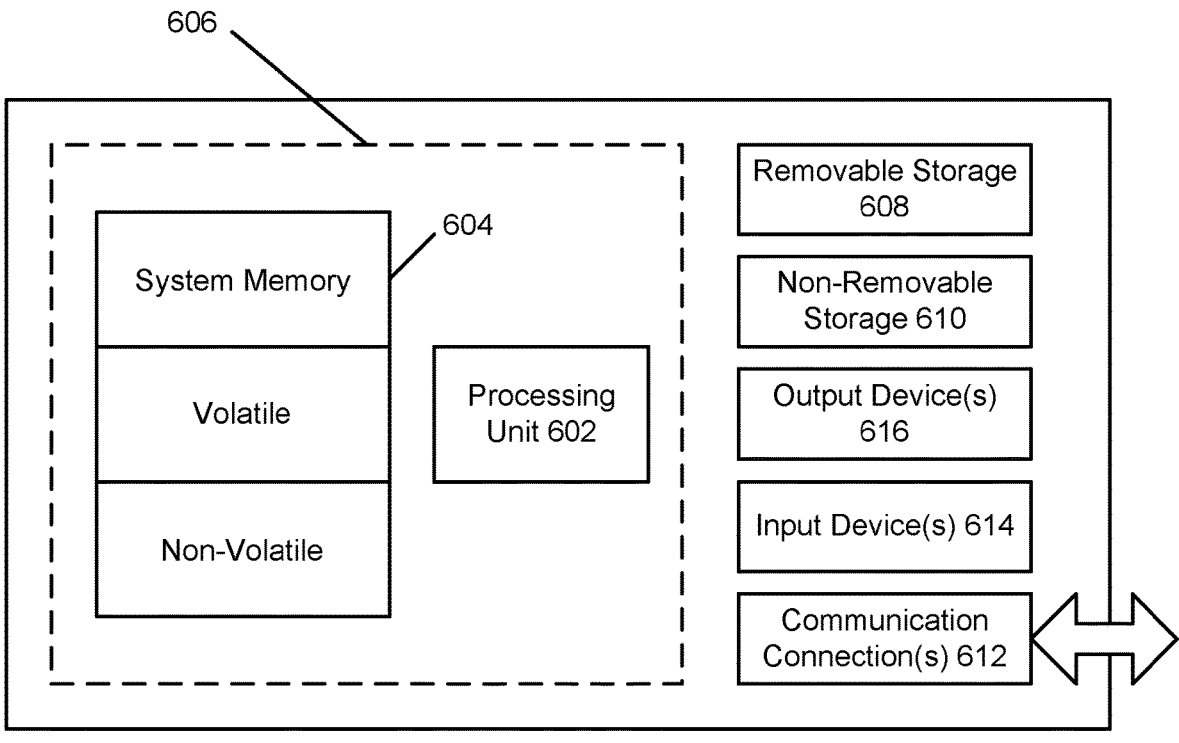
FIG. 6 shows an exemplary computing environment in which example embodiments and aspects may be implemented.

FIG. 6 shows an exemplary computing environment in which example embodiments and aspects may be implemented. The computing device environment is only one example of a suitable computing environment and is not intended to suggest any limitation as to the scope of use or functionality.

Numerous other general purpose or special purpose computing devices environments or configurations may be used. Examples of well-known computing devices, environments, and/or configurations that may be suitable for use include, but are not limited to, personal computers, server computers, handheld or laptop devices, multiprocessor systems, microprocessor-based systems, network personal computers (PCs), minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 6, an exemplary system for implementing aspects described herein includes a computing device, such as computing device 600. In its most basic configuration, computing device 600 typically includes at least one processing unit 602 and memory 604. Depending on the exact configuration and type of computing device, memory 604 may be volatile (such as random access memory (RAM)), non-volatile (such as read-only memory (ROM), flash memory, etc.), or some combination of the two. This most basic configuration is illustrated in FIG. 6 by dashed line 606.

Computing device 600 may have additional features/functionality. For example, computing device 600 may include additional storage (removable and/or non-removable) including, but not limited to, magnetic or optical disks or tape. Such additional storage is illustrated in FIG. 6 by removable storage 608 and non-removable storage 610.

Computing device 600 typically includes a variety of computer readable media. Computer readable media can be any available media that can be accessed by the device 600 and includes both volatile and non-volatile media, removable and non-removable media.

Computer storage media include volatile and non-volatile, and removable and non-removable media implemented in any method or technology for storage of information such as computer readable instructions, data structures, program modules or other data. Memory 604, removable storage 608, and non-removable storage 610 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 600. Any such computer storage media may be part of computing device 600.

Computing device 600 may contain communication connection(s) 612 that allow the device to communicate with other devices. Computing device 600 may also have input device(s) 614 such as a keyboard, mouse, pen, voice input device, touch input device, etc. Output device(s) 616 such as a display, speakers, printer, etc. may also be included. All these devices are well known in the art and need not be discussed at length here.

In an implementation, a method comprises: receiving a first integrated circuit and a second integrated circuit by a computing device; generating a first signature of the first integrated circuit using a cavity resonator by the computing device; generating a second signature of the second integrated circuit using the cavity resonator by the computing device; comparing the first signature with the second signature by the computing device; and determining that the second integrated circuit is an anomalous integrated circuit based on the comparison by the computing device.

Implementations may include some or all of the following features. An anomalous integrated circuit is one or more of a defective integrated circuit or a counterfeit integrated circuit. Generating the first signature of the first integrated circuit using the cavity resonator comprises: placing the first integrated circuit in the cavity resonator at a first predetermined position; providing an electromagnetic wave through the cavity resonator; while the first integrated circuit is in the first predetermined position, measuring a first resonate frequency in the cavity resonator; and generating the first signature based on the measured first resonate frequency. Generating the first signature of the first integrated circuit using the cavity resonator further comprises: placing the first integrated circuit in the cavity resonator at a second predetermined position; while the first integrated circuit is in the second predetermined position, measuring a second resonate frequency in the cavity resonator; and generating the signature based on the measured first resonate frequency and the second resonate frequency. The method further comprises: while the first integrated circuit is in the first position, measuring a return loss value of the first integrated circuit; and generating the signature based on the measured first resonate frequency and the return loss value. Providing the electromagnetic wave through the cavity resonator comprises providing the electromagnetic wave through the cavity at each frequency of a plurality of frequencies. Comparing the first signature with the second signature comprises subtracting the first signature from the second signature. Determining that the second integrated circuit is an anomalous integrated circuit based on the comparison comprises determining that a difference between the first signature and the second signature is greater than a threshold.

In an implementation, a method comprises: receiving a plurality of integrated circuits by a computing device, wherein each integrated circuit is associated with an identifier; for each integrated circuit of the plurality of integrated circuits, generating a signature for the integrated circuit by the computing device; generating a model using the signature generated for each integrated circuit by the computing device; receiving a signature for a first integrated circuit not in the plurality of integrated circuits by the computing device; and using the model and the received signature, predicting the identifier associated with the first circuit by the computing device.

Implementations may include some or all of the following features. The method further comprises determining that the predicted identifier does not match an identifier associated with the first integrated circuit, and in response, determining that the first integrated circuit is an anomalous integrated circuit. The analogous integrated circuit is one or more of a defective integrated circuit or a counterfeit integrated circuit. The model is one or more of a random forest classifier, a k-nearest neighbor classifier, or a support vector machine. Generating the signature for the integrated circuit comprises generating the signature for the integrated circuit using a cavity resonator. Generating the signature for the integrated circuit using the cavity resonator comprises: placing the integrated circuit in the cavity resonator at a first predetermined position; providing an electromagnetic wave through the cavity resonator; while the integrated circuit is in the first predetermined position, measuring a first resonate frequency in the cavity resonator; and generating the signature based on the measured first resonate frequency. Generating the signature for the integrated circuit using the cavity resonator further comprises: placing the integrated circuit in the cavity resonator at a second predetermined position; while the integrated circuit is in the second predetermined position, measuring a second resonate frequency in the cavity resonator; and generating the signature based on the measured first resonate frequency and the second resonate frequency. The method further comprises: while the first integrated circuit is in the first predetermined position, measuring a return loss value of the integrated circuit and generating the signature based on the measured first resonate frequency and the return loss value.

In an implementation, a system comprises: a cavity resonator; at least one computing device; and a computer-readable medium storing computer-executable instructions that when executed by the at least one computing device causes the at least one computing device to: generate a first signature of a first integrated circuit using the cavity resonator; generate a second signature of a second integrated circuit using the cavity resonator; compare the first signature with the second signature; and determine that the second integrated circuit is an anomalous integrated circuit based on the comparison.

Implementations may include some or all of the following features. The anomalous integrated circuit is one or more of a defective integrated circuit or a counterfeit integrated circuit. The system further comprises computer-executable instructions that when executed by the at least one computing device causes the at least one computing device to: place the first integrated circuit in the cavity resonator at a first predetermined position; provide an electromagnetic wave through the cavity resonator; while the first integrated circuit is in the first predetermined position, measure a first resonate frequency in the cavity resonator; and generate the first signature based on the measured first resonate frequency. The system further comprises computer-executable instructions that when executed by the at least one computing device causes the at least one computing device to: while the first integrated circuit is in the first predetermined position, measure a return loss value of the first integrated circuit; and generate the signature based on the measured first resonate frequency and the return loss value.

It should be understood that the various techniques described herein may be implemented in connection with hardware components or software components or, where appropriate, with a combination of both. Illustrative types of hardware components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. The methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   receiving a first integrated circuit and a second integrated circuit by a computing device;
   generating a first signature of the first integrated circuit using a cavity resonator by the computing device by:
      placing the first integrated circuit in the cavity resonator at a first predetermined position;

providing an electromagnetic wave through the cavity resonator;
      while the first integrated circuit is in the first predetermined position, measuring a first resonate frequency in the cavity resonator; and
      generating the first signature based on the measured first resonate frequency;
   generating a second signature of the second integrated circuit using the cavity resonator by the computing device;
   comparing the first signature with the second signature by the computing device; and
   determining that the second integrated circuit is an anomalous integrated circuit based on the comparison by the computing device.

2. The method of claim 1, wherein an anomalous integrated circuit is one or more of a defective integrated circuit or a counterfeit integrated circuit.

3. The method of claim 1, wherein generating the first signature of the first integrated circuit using the cavity resonator further comprises:
   placing the first integrated circuit in the cavity resonator at a second predetermined position;
   while the first integrated circuit is in the second predetermined position, measuring a second resonate frequency in the cavity resonator; and
   generating the first signature based on the measured first resonate frequency and the second resonate frequency.

4. The method of claim 1, further comprising:
   while the first integrated circuit is in the first position, measuring a return loss value of the first integrated circuit; and
   generating the signature based on the measured first resonate frequency and the return loss value.

5. The method of claim 1, wherein providing the electromagnetic wave through the cavity resonator comprises providing the electromagnetic wave through the cavity at each frequency of a plurality of frequencies.

6. The method of claim 1, wherein comparing the first signature with the second signature comprises subtracting the first signature from the second signature.

7. The method of claim 1, wherein determining that the second integrated circuit is an anomalous integrated circuit based on the comparison comprises determining that a difference between the first signature and the second signature is greater than a threshold.

8. A system comprising:
   a cavity resonator;
   at least one computing device; and
   a non-transitory computer-readable medium storing computer-executable instructions that when executed by the at least one computing device causes the at least one computing device to:
   generate a first signature of a first integrated circuit using the cavity resonator by:
      placing the first integrated circuit in the cavity resonator at a first predetermined position;
      providing an electromagnetic wave through the cavity resonator;
      while the first integrated circuit is in the first predetermined position, measuring a first resonate frequency in the cavity resonator; and
      generating the first signature based on the measured first resonate frequency;
   generate a second signature of a second integrated circuit using the cavity resonator;
   compare the first signature with the second signature; and determine that the second integrated circuit is an anomalous integrated circuit based on the comparison.

9. The system of claim 8, wherein the anomalous integrated circuit is one or more of a defective integrated circuit or a counterfeit integrated circuit.

10. The system of claim 8, further comprising computer-executable instructions that when executed by the at least one computing device causes the at least one computing device to:

while the first integrated circuit is in the first predetermined position, measure a return loss value of the first integrated circuit; and generate the first signature based on the measured first resonate frequency and the return loss value.

* * * * *